United States Patent [19]

Noguchi et al.

[11] Patent Number: 5,240,816
[45] Date of Patent: Aug. 31, 1993

[54] METHOD OF PRODUCING A SCREEN FOR PRINTING A HEATING LINE PATTERN AND A METHOD OF FORMING A HEATING LINE PATTERN ON A GLASS PLATE

[75] Inventors: Noriyuki Noguchi, Kawasaki; Naokazu Mazaki, Musashino, both of Japan

[73] Assignee: Asahi Glass Company Ltd., Tokyo, Japan

[21] Appl. No.: 714,586

[22] Filed: Jun. 13, 1991

[30] Foreign Application Priority Data

Jun. 18, 1990 [JP] Japan ................. 2-159448

[51] Int. Cl.⁵ .............................................. G03F 7/12
[52] U.S. Cl. ................................... 430/308; 430/320;
430/324; 101/128.4; 101/129; 219/203;
219/522; 219/543; 219/544; 427/108;
427/126.2; 427/165; 427/282; 427/287;
427/376.3
[58] Field of Search ............... 430/308, 320, 312, 324;
427/282, 287, 108, 126.2, 126.3, 165, 376.3;
101/127, 128.4, 114, 129, 128.2; 219/203, 543,
547, 522

[56] References Cited

U.S. PATENT DOCUMENTS

| | | | |
|---|---|---|---|
| 3,659,079 | 4/1972 | Whittemore | 219/522 |
| 3,851,581 | 12/1974 | Baum et al. | 430/320 |
| 3,852,564 | 12/1974 | Baum et al. | 219/522 |
| 4,379,737 | 4/1983 | Mearig | |
| 4,450,346 | 5/1984 | Boaz | 219/522 |

FOREIGN PATENT DOCUMENTS 0281351 9/1988 European Pat. Off. .
3616697 11/1987 Fed. Rep. of Germany .
2242709 3/1975 France .
57-59222 12/1982 Japan ......................... 427/165

OTHER PUBLICATIONS

Patent Abstracts of Japan, vol. 7, No. 220 (P-226)[1365] Sep. 30, 1983. & JP-A-114039, Jul. 7, 1983, Y. Kimura "Photoengraving Method for Screen Mask".

Primary Examiner—Marion E. McCamish
Assistant Examiner—Janis L. Dote
Attorney, Agent, or Firm—Oblon, Spivak, McClelland, Maier & Neustadt

[57] ABSTRACT

A method of producing a screen for printing a heating line pattern which comprises the steps of: depositing a first photosensitive emulsion layer on a screen, masking a predetermined portion of the first photosensitive emulsion layer corresponding to a heating line pattern comprising bus bars and heating lines, exposing the first photosensitive emulsion layer except the masked portion to form the first cured emulsion layer, removing the unexposed portion of the first photosensitive emulsion layer to form the permeable portion in the first cured emulsion layer, depositing a second photosensitive emulsion layer at least on the first cured emulsion layer adjacent to the permeable portions corresponding to the bus bars, masking predetermined portions of the second photosensitive emulsion layer on the first cured emulsion layer, exposing the second photosensitive emulsion layer except the masked portions to form a second cured emulsion layer comprised of unmasked exposed portions, and removing the unexposed portion of the second photosensitive emulsion layer to leave unmasked exposed portions of the second cured emulsion layer on said first cured emulsion layer.

2 Claims, 3 Drawing Sheets

METHOD OF PRODUCING A SCREEN FOR PRINTING A HEATING LINE PATTERN AND A METHOD OF FORMING A HEATING LINE PATTERN ON A GLASS PLATE

BACKGROUND OF THE INVENTION

1. Field of the Invention

This invention relates to a method of producing a screen for printing a heating line pattern and a method of forming a heating line pattern on a glass plate suitable for making an anti-fogging windshield.

2. Discussion of the Related Art

As a windshield which is fixed to a rear window frame or the like of an automobile, an anti-fogging windshield having an anti-fogging function to secure a safety view, has much been used.

In the anti-fogging windshield of this case, conventionally, an electrically conductive paste in a pertinent heating line pattern, is printed and sintered, which forms a heating line composed of bus bars and heating lines. The heating line generates heat by flowing electric current in it, by which a surface of the windshield is heated, and which performs defogging and anti-fogging.

In case of the above anti-fogging windshield, depending on a pattern of the heating line formed, the temperature of the surrounding area of an allocated part of an electricity feeding terminal in the bus bar is abnormally elevated in flowing electric current.

This is because, since the bus bar is formed by printing of the paste with uniform thickness near the electricity feeding terminal as well as the other part, much electric current is flown at the bus bar portion in electric heating and especially heat generation quantity near the electricity feeding terminal is increased compared with the other portion.

Therefore, conventionally, a copper plate is stuck at the surrounding area of the electricity feeding terminal in the bus bar, or the paste is multiple-coated, so that the thickness of the bus bar near the electricity feeding terminal is increased, and so that the resistance value of the surrounding area of the electricity feeding terminal is decreased, as a measure to prevent the excessive heat generation.

However, such copper sticking operation or an operation of multiple-coating of the paste, causes the complexity of the production process of the anti-fogging windshield, which not only lowers the operational efficiency, but also increases the production cost.

Moreover, when the thickness of the bus bar near the electricity feeding terminal is the same as that of the other portion, the strength of the soldering of the electricity feeding terminal on the bus bar becomes weak. As the result, the soldered terminal may break off.

As a measure for this problem, it may be considered that the thickness of the paste itself printed through the screen is increased, by increasing the thickness of the screen per se in the screen.

However, in resorting to these measures, the resistance value of the heating lines is also decreased. As a result, much electric power is required to sufficiently heat the heating lines, which causes increase of the power consumption and is not practical.

SUMMARY OF THE INVENTION

It is an object of the present invention to provide a method or producing a screen for printing a heating line pattern and a method of forming a heating line pattern on a glass plate using the screen, capable of solving the above problems.

According to an aspect of the invention there is provided a method of producing a screen for printing a heating line pattern which comprises steps of depositing a first photosensitive emulsion layer on a screen, masking a predetermined portion of said first photosensitive emulsion layer corresponding to a heating line pattern comprising bus bars and heating lines, exposing said first photosensitive emulsion layer except the masked portion to form the first cured emulsion layer, removing the unexposed portion of said first photosensitive emulsion layer to form the permeable portion in the first cured emulsion layer, depositing a second photosensitive emulsion layer at least on the first cured emulsion layer adjacent to the permeable portions corresponding to the bus bars, masking predetermined portions of said second photosensitive emulsion layer on the first cured emulsion layer, exposing said second photosensitive emulsion layer except the masked portions to form a second cured emulsion layer which is defined by the exposed unmasked portions, removing the unexposed portion of the second photosensitive emulsion layer to leave exposed unmasked portions of the second cured emulsion layer on said first cured emulsion layer.

According to an another aspect of the invention, there is provided a method of forming a heating line pattern on a glass plate which comprises steps of; preparing a screen for printing a heating line pattern by the method which comprises: depositing a first photosensitive emulsion layer on a screen, masking a predetermined portion of said first photosensitive emulsion layer corresponding to the heating line pattern comprising bus bars and heating lines, exposing said first photosensitive emulsion layer except the masked portion to form the first cured emulsion layer, removing the unexposed portion of said first photosensitive emulsion layer to form the permeable portion in the first cured emulsion layer, depositing a second photosensitive emulsion layer at least on the first cured emulsion layer adjacent to the permeable portions corresponding to the bus bars, masking predetermined portions of said second photosensitive emulsion layer on the first cured emulsion layer, exposing said second photosensitive emulsion layer except the masked portions to form a second cured emulsion layers which is defined by the exposed unmasked portions, removing the unexposed portion of the second photosensitive emulsion layer to leave exposed unmasked portions of the second cured emulsion layer on said first cured emulsion layer, arranging said screen on a glass plate with said cured emulsion layers disposed on the glass plate, applying a conductive paste through said permeable portion of the screen on the glass plate, baking the printed conductive paste to form a heating line pattern on the glass plate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
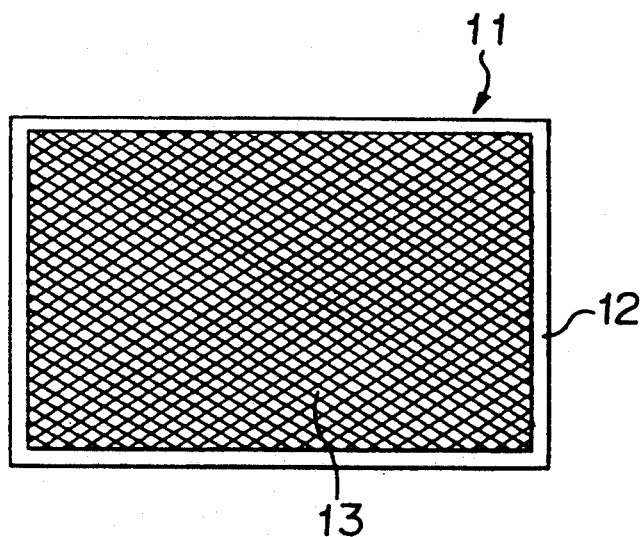
FIG. 1 is a plan showing an embodiment of the screen which is utilized as a base material in the method of producing a screen for printing a heating line pattern, according to the present invention.

In the drawings, a numeral 11 designates a screen plate, 12, a frame, 13, a screen, 14, first photosensitive emulsion layer, 15, a permeable portion, 16, an impermeable portion, 16a, a first cured emulsion layer, 17, second photosensitive emulsion layer, 18, an exposure portion, 18a, a second cured emulsion layer, 21, a glass plate, 23, a paste, and 25, a space portion.

Explanation will be given to an embodiment referring to the drawings.

FIG. 1 is a plan showing an embodiment of the screen plate 11 which is utilized as a base material in producing the screen for printing a heating line pattern according to the present invention. The screen plate 11 is composed of the frame 12 made of a pertinent material such as aluminum, and the mesh-like screen 13 made of a nylon or polyester series synthetic fiber or the like, stretched in the frame 12.

In producing the screen for printing a heating line pattern of the present invention using the screen plate 11 of the above constitution, first of all, the first photosensitive emulsion layer 14 is applied on the screen 13, with the thickness of about 90 to 100 $\mu$m including the thickness in which the first photosensitive emulsion layer 14 is imbedded in the mesh of the screen 13.

Figure 2:
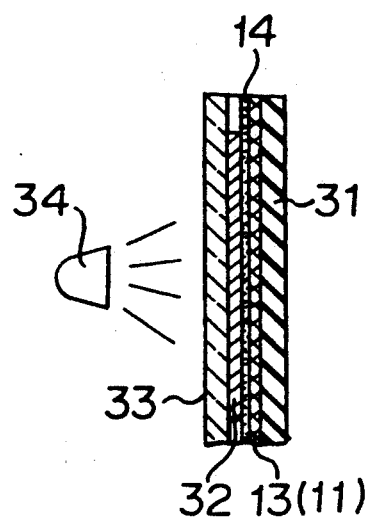
FIG. 2 is an explanatory diagram showing a positional relationship in an exposure operation which is a step in the method for producing the screen, according to the present invention.

FIG. 2 is a plan showing an example of an exposure operation which is performed after applying the first photosensitive emulsion layer 14 on the screen 13. At the backside of the screen plate 11, the backside plate 31 formed by a gummy material, is arranged. At the front side of the screen plate 11, the masking material 32 such as a masking positive film, having a beam blocking portion which enables beam blocking of the heating line pattern portion composed of a predetermined pattern, is arranged. An ultraviolet ray is irradiated on the masking material 32, through the glass material 33, for example, by the mercury light 34. The first photosensitive emulsion layer 14 at the portion except the portion corresponding to the above beam blocking portion, is exposed and cured.

Figure 3:
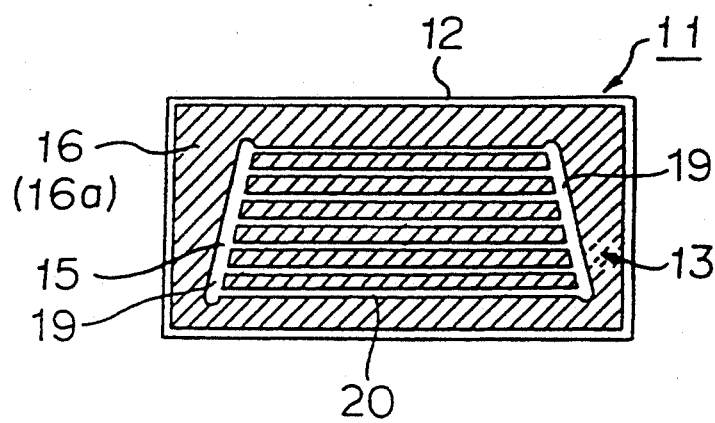
FIG. 3 is a plan showing a screen pattern of the screen in forming the first cured emulsion layer.

FIG. 3 is a plan showing an example of the present invention, in which after the above exposure operation is finished, the permeable portion 15 which is formed by washing and removing the photosensitive emulsion at the beam blocking portion, and the impermeable portion 16 in which the first photosensitive emulsion layer 14 is left as the first cured emulsion layer 16a, are formed.

The permeable portion 15 shown in FIG. 3 comprises the permeable portion 19 corresponding to the bus bar, and the permeable portion 20 corresponding to the heating lines.

Then a second photosensitive emulsion layer 17 is deposited at least on the first cured emulsion layer 16a adjacent to the permeable portion 15 corresponding to the bus bars. It is preferable to deposit the second photosensitive emulsion layer 17 on a predetermined portion as shown in FIG. 4, in view of operation efficiency and the thickness uniformity of the second photosensitive emulsion layer 17.

Figure 4:
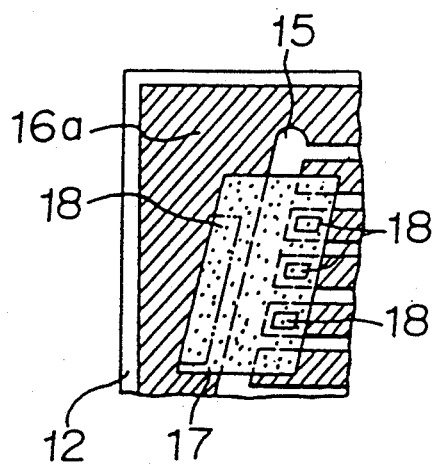
FIG. 4 is an enlarged plan of the important part showing a state in which a second photosensitive emulsion is over-coated on the screen shown in FIG. 3, and exposed.

FIG. 4 is an enlarged plan of the important part showing a state in which after the treatment shown in FIG. 3 is performed, the second photosensitive emulsion layer 17 is applied further on a predetermined portion comprising the permeable portion 15 corresponding to the bus bar portion and first cured emulsion layer 16a adjacent to the predetermined portion.

According to FIG. 4, the second photosensitive emulsion layer 17 is applied with a thickness of about 30 to 40 $\mu$m, in the permeable portion 15 corresponding to the bus bar portion and the heating lines portion adjacent to the bus bar portion, and on the first cured emulsion layer 16a in a pertinent area.

Then predetermined portions except the portion 18 of the second photosensitive emulsion layer 17 is masked, for example, by an infrared ray film, not shown, and exposed. The unmasked portion 18 is exposed and cured to be the second cured emulsion layer defined by the exposed unmasked portions 18a. It is preferable to form the exposed unmasked portions the second cured emulsion layer which surround the predetermined portion of the permeable portion 15 corresponding to the bus bar, so that the predetermined portion of the bus bar surrounded by the exposed unmasked portions of the second cured emulsion layer can later be screen-printed with increased thickness.

Also it is preferable to form the exposed unmasked portions 18a of the second cured emulsion layer on at least two zones of the first cured emulsion layer 16a with the permeable portion 15 corresponding to the bus bar therebetween, so that the portion of the bus bar between the exposed unmasked portions 18a of the second cured emulsion layer can later be screen-printed with increased thickness.

Figure 5:
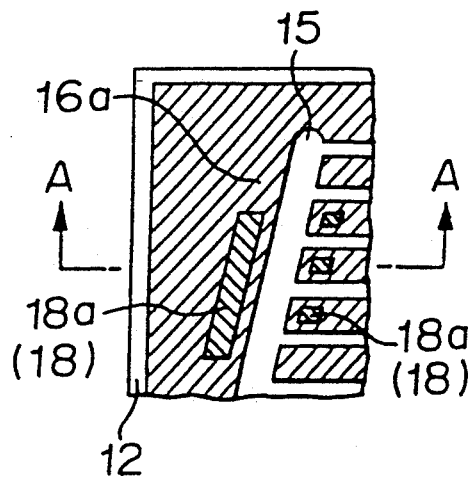
FIG. 5 is an enlarged plan of the important part showing a screen pattern after the second photosensitive emulsion is exposed under the state shown in FIG. 4.

FIG. 5 is an enlarged plan of the important part showing an example of the screen for printing a heating line pattern produced by the method of the present invention, in which after the treatment shown in FIG. 4 is performed, the second photosensitive emulsion layer 17 situated at the unexposed portion, is washed and removed, and a cured part of the second photosensitive emulsion layer 17 of the exposure portion 18 is left as the second cured emulsion layer defined by the exposed unmasked portions 18a.

According to FIG. 5, the exposed unmasked portions 18a of the second cured emulsion layer is formed on the first cured emulsion layer 16a, the positional relationship in which the exposed unmasked portions 18a of the second cured emulsion layer surround the permeable portion 15 corresponding to the bus bar portion, in the neighborhood of the permeable portion 15 comprising the heating line portion adjacent to the bus bar portion.

Figure 6:
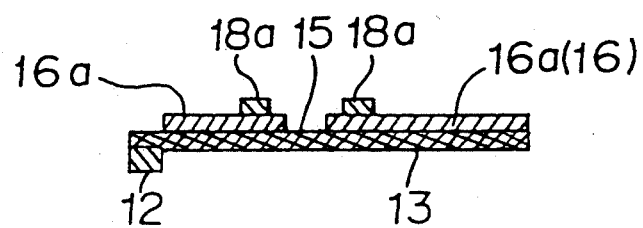
FIG. 6 is a sectional view taken along A—A line of FIG. 5.

As is apparent in FIG. 6 which is a sectional view taken along A—A line in FIG. 5, on the screen 13, the permeable portion 15 and the first cured emulsion layer 16a which is the impermeable portion 16, are formed. Furthermore, on top of the first cured emulsion layer 16a, adjacent to the permeable portion 15, the exposed unmasked portions of the second emulsion layer are formed.

Figure 7:
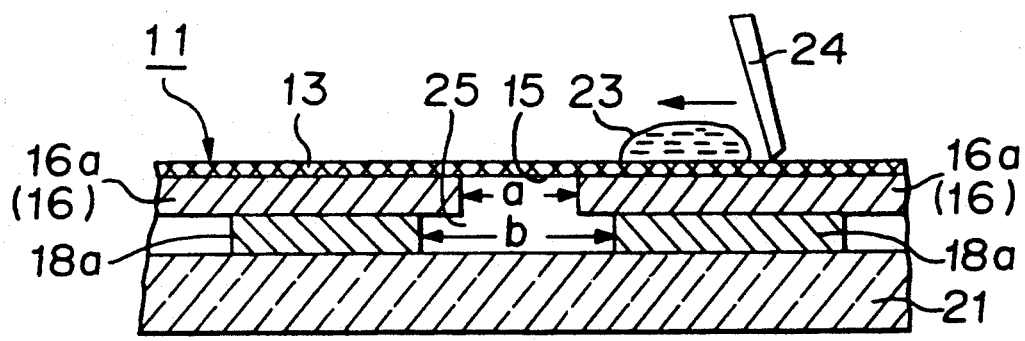
FIG. 7 is an enlarged longitudinal sectional diagram showing a positional relationship in spreading the paste, which is a step in the method of forming a heating line on a windshield, according to the present invention.

FIG. 7 is a sectional diagram showing a positional relationship in which the screen plate 11 produced by the method of the present invention shown in FIG. 6, is utilized, and the heating line pattern is transcribed on the glass plate 21 which is a step of a method of forming the heating line on the glass plate 21 according to the present invention.

The screen plate 11 is disposed on the glass plate 21, with a positional relationship in which the side of the second cured emulsion layer 18a is disposed on the glass plate 21. After that, the conductive paste 23, for example, a paste containing glass frits and metal (ex. Ag) powder, is supplied on the screen 13 of the screen plate 11. This paste 23 is spread by using, for instance, a gum squeegee 24.

In this occasion, the paste 23 is applied on the glass plate 21 through the permeable portion 15, transcribed, and printed as a heating line pattern. Between the screen 13 and the glass plate 21, the space portion 25 is partially formed in which the space "a" between the respective first cured emulsion layers 16a, and the space "b" between the respective second cured emulsion layers 18a have the relationship of a <b, which can enhance the spreadability of the paste 23, and the separability between the paste 23 after the spreading and the screen 13, when the screen plate 11 is separated from the glass plate 21 after the printing. As a result, the paste 23 with a width of the space "a" can beautifully be applied on the glass plate 21.

After the paste 23 is printed on the glass plate 21 in a heating line pattern, the glass plate 21 is processed by a preliminarily drying and charged into a heating furnace in which the glass plate 21 is heated at about 500° to 650° C. By baking the printed portion of the heating line pattern, a heating line composed of the bus bar and the heating lines can be formed on the glass plate 21.

Since the forming of the heating line on the glass plate according to the present invention, is performed by the above procedure, the predetermined portion of the bus bar in the heating line, can be formed in which the thickness is increased compared with the other portion.

Therefore, when an electricity feeding terminal is fixed to the portion having the increased thickness, of the bus bar portion, and electricity is supplied through this electricity feeding terminal, the excessive heat generation of the bus bar portion printed thicker can be reduced, since the resistance value of the bus bar portion printed thicker is lower than that in other bus bar portion and the heating lines, and the peeling off of the electricity feeding terminal can certainly be prevented in view of its strength.

As stated above, according to the present invention, by using the screen formed to have the permeable portion of the heating line pattern, and an impermeable portion composed of the first cured emulsion layer and the exposed unmasked portions of the second cured emulsion layer, and by arranging the screen in which the side of the second cured emulsion layer is disposed on the glass plate, the space portion can partially be formed between the permeable portion of the screen corresponding to the bus bar in the heating line pattern and the glass plate surface, in which the space formed between the respective exposed unmasked portions 18a of the second cured emulsion layer is larger than the space formed between the respective portions 16a of the first cured emulsion layer. Under this positional relationship, when by spreading the conductive paste on the screen, the specified portion of the bus bar in this heating line, can be beautifully formed with increased thickness compared with the other portion.

Accordingly, when an electricity feeding terminal is fixed to the bus bar portion printed thicker, the excessive heat generation, can be prevented by decreasing the resistance value, without utilizing a copper plate, or by recoating a paste as in the conventional methods. Therefore the enhancement of the operational efficiency and the lowering of the production cost can be achieved. Furthermore, since the specified portion of the bus bar is formed with the increased thickness, the electricity feeding terminal can be arranged preventing certainly the peeling off of the terminal in view of the strength.

We claim:
1. A method of producing a screen for printing a heating line pattern which comprises the steps of:
   depositing a first photosensitive emulsion layer on a screen;
   masking a predetermined portion of said first photosensitive emulsion layer corresponding to a heating line a pattern comprising bus bars and heating lines;
   exposing said first photosensitive emulsion layer except the masked portion to form a first cured emulsion layer;
   removing the unexposed portion of said first photosensitive emulsion layer to form at least one permeable portion corresponding to a bus bar in the first cured emulsion layer;
   depositing a second photosensitive emulsion layer at least on the first cured emulsion layer in an area adjacent to the at least one permeable portion corresponding to the bus bar;
   masking predetermined portions of said second photosensitive emulsion layer on the first cured emulsion layer such that unmasked portions of the second photosensitive emulsion layer are created on at least two zones of the first cured emulsion layer with the at least one permeable portion corresponding to the bus bar disposed therebetween;
   exposing the unmasked portions of said second photosensitive emulsion layer to form a second cured emulsion layer which is defined by said exposed unmasked portions, said second cured emulsion layer defined by said exposed unmasked portions surrounding said at least one permeable portion corresponding to the bus bar; and
   removing the unexposed masked portions of the second photosensitive emulsion layer to leave the second cured emulsion layer defined by said exposed unmasked portions on said first cured emulsion layer;
   wherein a distance between the at least two zones on which the portions of the second cured emulsion layer are formed is larger than a width of the permeable portion corresponding to the bus bar.

2. A method of forming a heating line pattern on a glass plate which comprises the steps of:

preparing a screen for printing a heating line pattern by the method which comprises:

depositing a first photosensitive emulsion layer on a screen;

masking a predetermined portion of said first photosensitive emulsion layer corresponding to a heating line pattern comprising bus bars and heating lines;

exposing said first photosensitive emulsion layer except the masked portion to form a first cured emulsion layer;

removing the unexposed portion of said first photosensitive emulsion layer to form at least one permeable portion corresponding to a bus bar in the first cured emulsion layer;

depositing a second photosensitive emulsion layer at least on the first cured emulsion layer adjacent to the at least one permeable portion corresponding to the bus bar;

masking predetermined portions of said second photosensitive emulsion layer on the first cured emulsion layer such that unmasked portions of the second photosensitive emulsion layer are created on at least two zones of the first cured emulsion layer with the at least one permeable portion corresponding to the bus bar disposed therebetween;

exposing the unmasked portions of said second photosensitive emulsion layer to form a second cured emulsion layer defined by said exposed unmasked portions, said second cured emulsion layer defined by said exposed unmasked portions surrounding said at least one permeable portion corresponding to the bus bar;

removing the unexposed masked portions of the second photosensitive emulsion layer to leave the second cured emulsion layer defined by said exposed unmasked portions on said first cured emulsion layer;

arranging said screen on the glass plate with said first and second cured emulsion layers disposed on the glass plate;

applying a conductive through said permeable portion of the screen on the glass plate; and baking the printed conductive paste to form a heating line pattern on the glass plate;

wherein a distance between the at least two zones on which the portions of the second cured emulsion layer are formed in larger than a width of the permeable portion corresponding to the bus bar.

* * * * *